(12) United States Patent
Chen et al.

(10) Patent No.: US 11,619,544 B2
(45) Date of Patent: Apr. 4, 2023

(54) VIBRATION SENSOR HAVING VENT FOR PRESSURE ENHANCING MEMBER

(71) Applicant: MERRY ELECTRONICS CO., LTD., Taichung (TW)

(72) Inventors: Jen-Yi Chen, Taichung (TW); Chao-Sen Chang, Taichung (TW); Yueh-Kang Lee, Taichung (TW)

(73) Assignee: MERRY ELECTRONICS CO., LTD., Taichung (TW)

( * ) Notice: Subject to any disclaimer, the term of this patent is extended or adjusted under 35 U.S.C. 154(b) by 50 days.

(21) Appl. No.: 17/444,285

(22) Filed: Aug. 3, 2021

(65) Prior Publication Data

US 2021/0364346 A1 Nov. 25, 2021

Related U.S. Application Data

(63) Continuation-in-part of application No. 17/022,046, filed on Sep. 15, 2020, now Pat. No. 11,467,027.
(Continued)

(30) Foreign Application Priority Data

Aug. 5, 2020 (TW) ................................. 109126563

(51) Int. Cl.
*G01H 11/06* (2006.01)
*H04R 19/04* (2006.01)
(Continued)

(52) U.S. Cl.
CPC .......... *G01H 11/06* (2013.01); *G01L 19/0092* (2013.01); *H04R 1/222* (2013.01);
(Continued)

(58) Field of Classification Search
CPC ........ G01H 11/06; G01H 11/08; G01H 17/00; H04R 19/04; H04R 31/003; H04R 1/04;
(Continued)

(56) References Cited

U.S. PATENT DOCUMENTS

2011/0272769 A1* 11/2011 Song .................... H04R 19/005
438/51
2016/0277844 A1* 9/2016 Kopetz .................... H04R 3/00
(Continued)

FOREIGN PATENT DOCUMENTS

CN 209314103 U * 8/2019
CN 209526834 U * 10/2019 ............. H04R 19/00
(Continued)

*Primary Examiner* — David L Singer
(74) *Attorney, Agent, or Firm* — CKC & Partners Co., LLC

(57) ABSTRACT

A vibration sensor is designed to have a pressure-enhancing member, a pressure sensing device and first, second, third chambers. An air gap is designed to enable the first chamber to be vented to the third chamber such that the first chamber is combined with the third chamber to obtain a communicable air volume. An adhesive layer is formed between a spacer and a circuit board, and the air gap is formed in an adhesive-absent section between the spacer and the circuit board. When the pressure-enhancing member is moved to squeeze the air in the second chamber, a sensitivity of the pressure sensing device will be greatly improved.

10 Claims, 7 Drawing Sheets

100d

Related U.S. Application Data

(60) Provisional application No. 62/994,292, filed on Mar. 25, 2020.

(51) Int. Cl.

| | | |
|---|---|---|
| *G01L 19/00* | (2006.01) | |
| *H05K 1/02* | (2006.01) | |
| *H05K 5/04* | (2006.01) | |
| *H04R 7/04* | (2006.01) | |
| *H04R 1/22* | (2006.01) | |

(52) U.S. Cl.
CPC ............... *H04R 7/04* (2013.01); *H04R 19/04* (2013.01); *H05K 1/0216* (2013.01); *H05K 5/04* (2013.01)

(58) Field of Classification Search
CPC ............... H04R 1/2876; H04R 19/005; H04R 2201/003; H04R 3/00; H04R 31/00; B81B 2201/0257; B81B 2203/0127; B81B 2203/0315; B81B 2203/04; B81B 2207/012; B81C 1/0023
See application file for complete search history.

(56) References Cited

U.S. PATENT DOCUMENTS

| | | | |
|---|---|---|---|
| 2019/0058956 A1* | 2/2019 | Zou | ............ H04R 19/04 |
| 2020/0056934 A1* | 2/2020 | Parker | ................. B81B 7/0061 |
| 2020/0255284 A1* | 8/2020 | Kueffner | ............ H04R 19/005 |
| 2020/0413177 A1* | 12/2020 | Zhang | .................. H04R 19/04 |

FOREIGN PATENT DOCUMENTS

| | | | | |
|---|---|---|---|---|
| CN | 209526836 U | * | 10/2019 | |
| CN | 209526837 U | * | 10/2019 | ............ H04R 19/04 |
| CN | 209526861 U | * | 10/2019 | |
| CN | 209526879 U | * | 10/2019 | ........... H04R 1/1083 |
| CN | 209526886 U | * | 10/2019 | |
| CN | 209659621 U | * | 11/2019 | ............ G01H 11/08 |
| CN | 110567663 A | * | 12/2019 | ............ G01H 11/08 |
| CN | 209945545 U | * | 1/2020 | ............ G01H 17/00 |
| CN | 111031424 A | * | 4/2020 | ........... H04R 1/1083 |
| CN | 210513399 U | * | 5/2020 | |
| CN | 210513400 U | * | 5/2020 | |
| CN | 210641062 U | * | 5/2020 | |
| CN | 210641073 U | * | 5/2020 | |
| CN | 111818409 A | * | 10/2020 | ............... H04R 1/02 |
| CN | 211930817 U | * | 11/2020 | ............ H04R 19/00 |
| CN | 211930820 U | * | 11/2020 | ............ H04R 19/04 |
| CN | 211930871 U | * | 11/2020 | ............ G01H 11/06 |
| CN | 211930872 U | * | 11/2020 | ............ H04R 19/00 |
| CN | 212086490 U | * | 12/2020 | |
| CN | 212110308 U | * | 12/2020 | |
| CN | 212324362 U | * | 1/2021 | |
| CN | 212486781 U | * | 2/2021 | |
| CN | 112565993 A | * | 3/2021 | |
| CN | 112565995 A | * | 3/2021 | ............ H04R 19/04 |
| CN | 112714388 A | * | 4/2021 | ............ H04R 19/04 |
| CN | 213280084 U | * | 5/2021 | |
| CN | 111131988 B | * | 6/2021 | ............ G01H 11/06 |
| CN | 213403413 U | * | 6/2021 | |
| CN | 213694145 U | * | 7/2021 | |
| CN | 110972045 B | * | 11/2021 | ............ G01H 17/00 |
| DE | 102007008518 A1 | * | 8/2008 | ........... B81B 7/0064 |

* cited by examiner

VIBRATION SENSOR HAVING VENT FOR PRESSURE ENHANCING MEMBER

CROSS-REFERENCE TO RELATED APPLICATION

This application claims priority to Taiwan Application Serial Number 109126563, filed Aug. 5, 2020, which is herein incorporated by reference in its entirety. This application is also a continuation-in-part of U.S. application Ser. No. 17/022,046, filed on Sep. 15, 2020, which claims priority of Provisional Application Ser. No. 62/994,292, filed Mar. 25, 2020, the disclosures of which are herein incorporated by reference in their entireties.

BACKGROUND

Field of Invention

The present disclosure relates to a sensor, and more particularly, to a vibration sensor.

Description of Related Art

At present, both handheld electronic devices and wearable electronic devices require functions provided by vibration sensors such that the performance requirements for vibration sensors are becoming higher. Therefore, various suppliers are actively seeking solutions for vibration sensors with high signal-to-noise ratio.

SUMMARY

In one or more embodiments, a vibration sensor includes a circuit board, a spacer, a pressure sensing device and a housing. The spacer is located on the circuit board. The pressure sensing device is located on the spacer, and the circuit board, the spacer and the pressure sensing device jointly form a first chamber and an air gap. The housing is mounted on the circuit board to defining a third chamber along with the circuit board, wherein the air gap allows the first chamber venting to the third chamber.

In one or more embodiments, a vibration sensor includes a circuit board, a pressure sensing device and a metal housing. The circuit board has a concave recess. The pressure sensing device is located on the circuit board and defines a first chamber along with the concave recess of the circuit board. The pressure sensing device includes a support board, a sensor and a pressure-enhancing member. The pressure-enhancing member includes a diaphragm and a mass. The support board, the sensor and the diaphragm of the pressure-enhancing member collectively define a second chamber. The metal housing is located on the circuit board and defines a third chamber along with the circuit board, wherein the circuit board has a sidewall which defines the concave recess and has a first through hole, and the first through hole allows the first chamber venting to the third chamber.

In one or more embodiments, a vibration sensor includes a circuit board, a pressure sensing device and a metal housing. The circuit board has a concave recess. The pressure sensing device is located on the circuit board and defines a first chamber along with the concave recess of the circuit board. The pressure sensing device includes a support board, a sensor and a pressure-enhancing member. The pressure-enhancing member includes a diaphragm and a mass. The support board, the sensor and the diaphragm of the pressure-enhancing member collectively define a second chamber. The metal housing is located on the diaphragm of the pressure-enhancing member and defines a third chamber along with the circuit board, wherein the circuit board has a sidewall which defines the concave recess and has a first through hole, and the first through hole allows the first chamber venting to the third chamber.

In one or more embodiments, the diaphragm covers the concave recess of the circuit board, and the diaphragm and the support board share substantially the same area.

In one or more embodiments, the support board covers the concave recess of the circuit board, and the diaphragm has an area smaller than that of the support board.

In one or more embodiments, the first, second and third chambers are all located between the metal housing and the circuit board, and the first chamber has an air-containing volume smaller than that of the third chamber.

In one or more embodiments, the support board has a second through hole aligned with the sensor.

In one or more embodiments, the first through hole has a bent cross-section.

In one or more embodiments, the diaphragm is located on the sidewall and covers the concave recess of the circuit board.

In one or more embodiments, the metal housing has a bottom in contact with the diaphragm, and the diaphragm has an area greater than that of the support board.

In one or more embodiments, the first through hole further goes through the diaphragm.

In one or more embodiments, the spacer is a rectangular closed-loop ring.

In one or more embodiments, the spacer includes a plurality of blocks, and the air gap is formed between any adjacent two of the blocks.

In one or more embodiments, the vibration sensor further includes an adhesive layer between the spacer and the circuit board, and the air gap is formed in an adhesive-absent section between the spacer and the circuit board.

In one or more embodiments, the adhesive layer has a U-shaped cross-section.

In one or more embodiments, the pressure sensing device comprises a support board, a sensor and a pressure-enhancing member, wherein the pressure-enhancing member comprises a diaphragm and a mass, wherein the support board, the sensor and the diaphragm of the pressure-enhancing member collectively define a second chamber.

In one or more embodiments, the second chamber is disposed between the first chamber and the third chamber.

In one or more embodiments, the diaphragm is disposed between the first chamber and the second chamber.

In one or more embodiments, the diaphragm is disposed between the third chamber and the second chamber.

In one or more embodiments, the housing is made of metal materials or dielectric materials covered with a metal layer.

In one or more embodiments, the first, second and third chambers are all disposed between the housing and the circuit board, and the first chamber has an air-containing volume smaller than that of the third chamber.

In sum, the vibration sensor disclosed herein includes a circuit board, a pressure-enhancing member, a pressure sensing device, and a metal housing to define the first, second, and third chambers. The metal housing covers the pressure-enhancing member and the pressure sensing device. Under the shielding of the metal housing, the pressure sensing device is more effective against electromagnetic interference (EMI). The circuit board has a sidewall to define a concave recess and the sidewall has a first through hole as a vent between the first chamber and the third chamber. The first chamber is combined with the third chamber to obtain a communicable air volume. When the pressure-enhancing member moves to squeeze the air in the second chamber, the sensitivity of the pressure sensing device will be greatly improved, and the vibration sensor can obtain a signal with a higher signal-to-noise ratio. Furthermore, an air-containing volume of the first chamber is smaller than that of the third chamber, which helps to increase air damping below the diaphragm, thereby making a smooth frequency response of the diaphragm.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
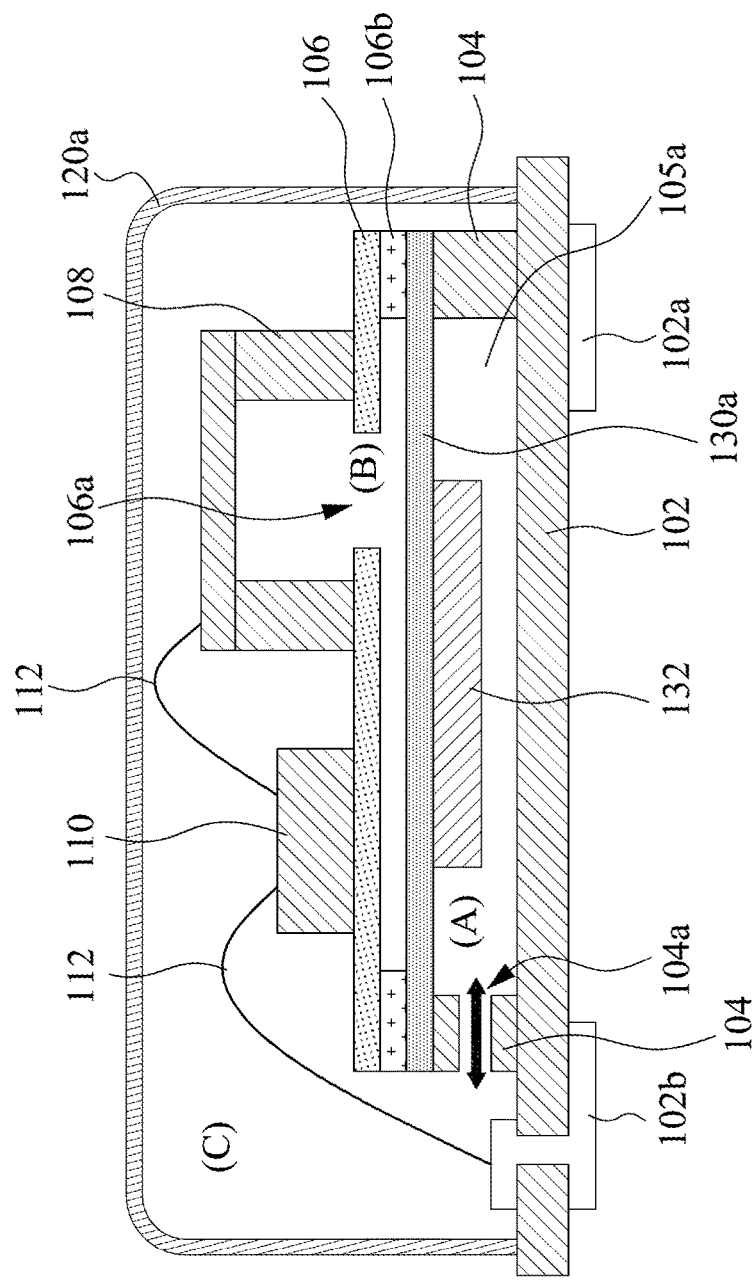
FIG. 1 illustrates a cross-sectional view of a vibration sensor according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1, which illustrates a cross-sectional view of a vibration sensor according to one embodiment of the present disclosure. A vibration sensor 100a includes a circuit board 102, a metal housing 120a, and a pressure sensing device. The circuit board 102 has a concave recess 105a. The pressure sensing device is set on the concave recess 105a of the circuit board 102 to jointly define a first chamber (A). The pressure sensing device includes at least a support board 106, a sensor 108, and a pressure-enhancing member. The pressure-enhancing member includes at least a diaphragm 130a and a mass 132 fixed on the diaphragm 130a, wherein the support board 106, the sensor 108 and the diaphragm 130a of the pressure-enhancing member jointly define a second chamber (B). The mass 132 is located in the first chamber (A).

The circuit board 102 also includes a sidewall 104 located on its periphery. The diaphragm 130a is installed on the sidewall 104. The circuit board 102 and its sidewall 104 jointly define the concave recess 105a.

The support board 106 also has a surrounding convex portion 106b abutting against the diaphragm 130a. The sensor 108 and the signal processing chip 110 are electrically connected to the circuit board 102 through metal wires 112, and the circuit board 102 is electrically connected to external components through its electrodes (102a, 102b).

The metal housing 120a is located on the circuit board 102 and defines a third chamber (C) together with the circuit board 102. The metal housing 120a covers the pressure-enhancing member and the pressure sensing device. Under the shielding of the metal housing 120a, the pressure sensing device is more effective against electromagnetic interference (EMI). The first chamber (A), the second chamber (B) and the third chamber (C) are all formed between the metal housing 120a and the circuit board 102. The air-containing volume of the first chamber (A) is smaller than that of the third chamber (C). This design helps to increase air damping under the diaphragm 130a, thereby making a smooth frequency response of the diaphragm 130a, which meets the characteristics required by the vibration sensor.

In this embodiment, a bottom end of the metal housing 120a abuts the circuit board 102, the diaphragm 130a covers the concave recess 105a of the circuit board 102, and an area of the diaphragm 130a is substantially equal to an area of the support board 106, but not being limited thereto.

In this embodiment, the sidewall 104 may optionally have a first through hole 104a such that the first chamber (A) could vent to the third chamber (C) via the first through hole 104a, but not being limited thereto. In addition, the support board 106 also has a second through hole 106a aligned with the sensor 108.

Figure 2:
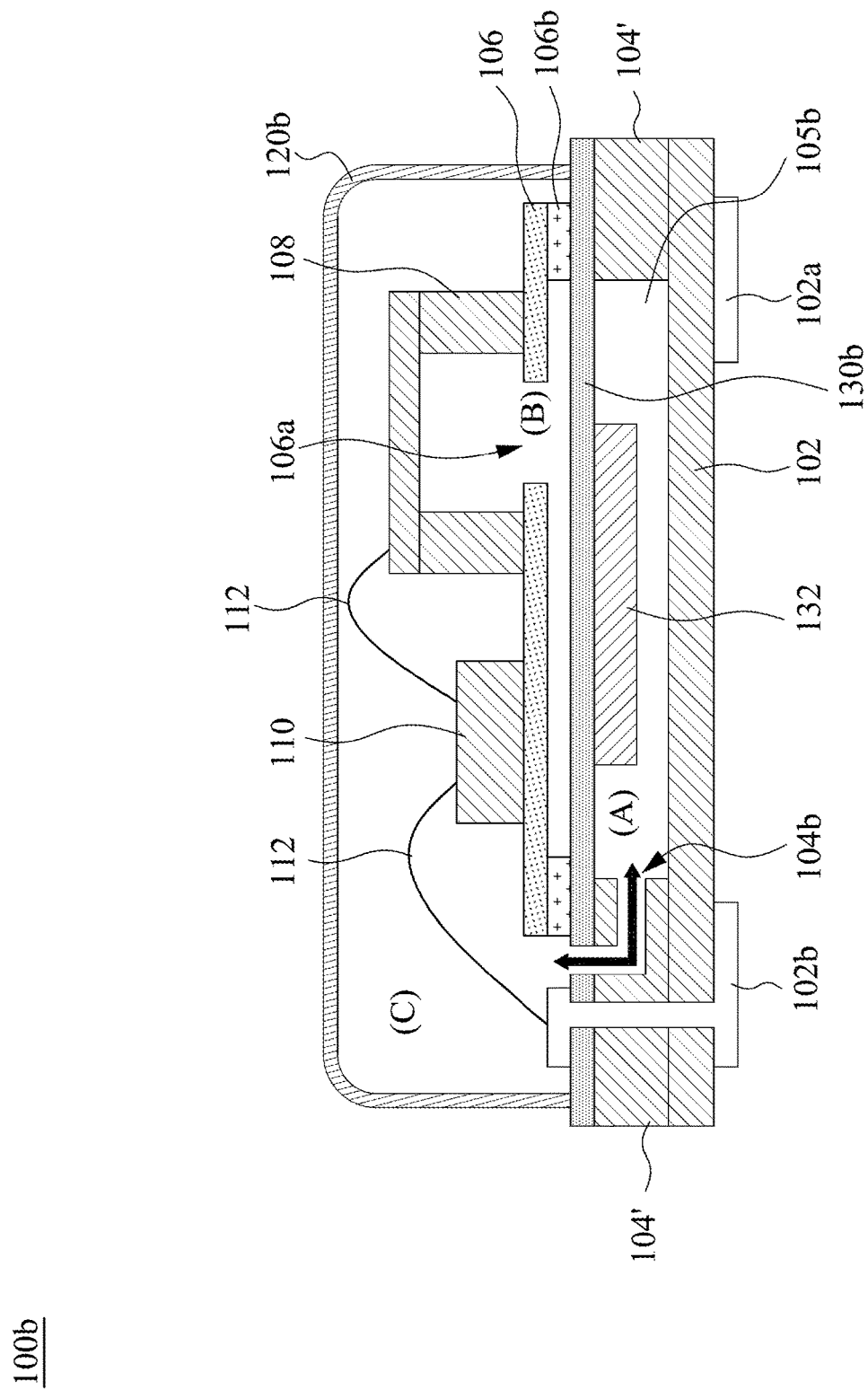
FIG. 2 illustrates a cross-sectional view of a vibration sensor according to another embodiment of the present disclosure.

Reference is made to FIG. 2, which illustrates a cross-sectional view of a vibration sensor according to another embodiment of the present disclosure. A vibration sensor 100b includes a circuit board 102, a metal housing 120b, and a pressure sensing device. The circuit board 102 has a concave recess 105b. The pressure sensing device is located over the concave recess 105b of the circuit board 102 to jointly define a first chamber (A). The pressure sensing device includes at least a support board 106, a sensor 108, and a pressure-enhancing member. The pressure-enhancing member includes at least a diaphragm 130b and a mass 132 fixed on the diaphragm 130b, wherein the support board 106, the sensor 108 and the diaphragm 103b of the pressure-enhancing member jointly define a second chamber (B). The mass 132 is located in the first chamber (A).

The circuit board 102 also includes a sidewall 104' on its periphery. The diaphragm 130b is secured to the sidewall 104'. The circuit board 102 and its sidewall 104' jointly define a concave recess 105b.

The support board 106 also has a surrounding convex portion 106b abutting against a top surface of the diaphragm 130b. The sensor 108 and the signal processing chip 110 are electrically connected to the circuit board 102 through metal wires 112, and the circuit board 102 is electrically connected to external components through its electrodes (102a, 102b).

The metal housing 120b is located on the diaphragm 130b, and defines a third chamber (C) together with the diaphragm 130b, wherein the metal housing 120b covers the pressure-enhancing member and the pressure sensing device such that the pressure-enhancing member and pressure sensing device are all located in the third chamber (C). Under the shielding of the metal housing 120b, the pressure sensing device is more effective against electromagnetic interference (EMI). Further, the first chamber (A), the second chamber (B) and the third chamber (C) are all formed between the metal housing 120b and the circuit board 102, and an air-containing volume of the first chamber (A) is smaller than that of the third chamber (C). This design helps increase air damping under the diaphragm 130b, thereby making a smooth frequency response of the diaphragm 130b.

In this embodiment, an area of the diaphragm 130b is substantially equal to an area of the circuit board 102, but greater than an area of the support board 106, and the diaphragm 130b covers the concave recess 105b of the circuit board 102 such that a bottom end of the metal housing 120b abuts the diaphragm 130b, but not being limited thereto.

In this embodiment, the first chamber (A) could vent to the third chamber (C) via the first through hole 104b. The first through hole 104b passes through the sidewall 104' and further passes through the diaphragm 130b. The cross-section of the first through hole 104b has a bent angle (for example, the L-shaped bent cross-section in the figure). In addition, the support board 106 also has a second through hole 106a aligned with the sensor 108.

Figure 3:
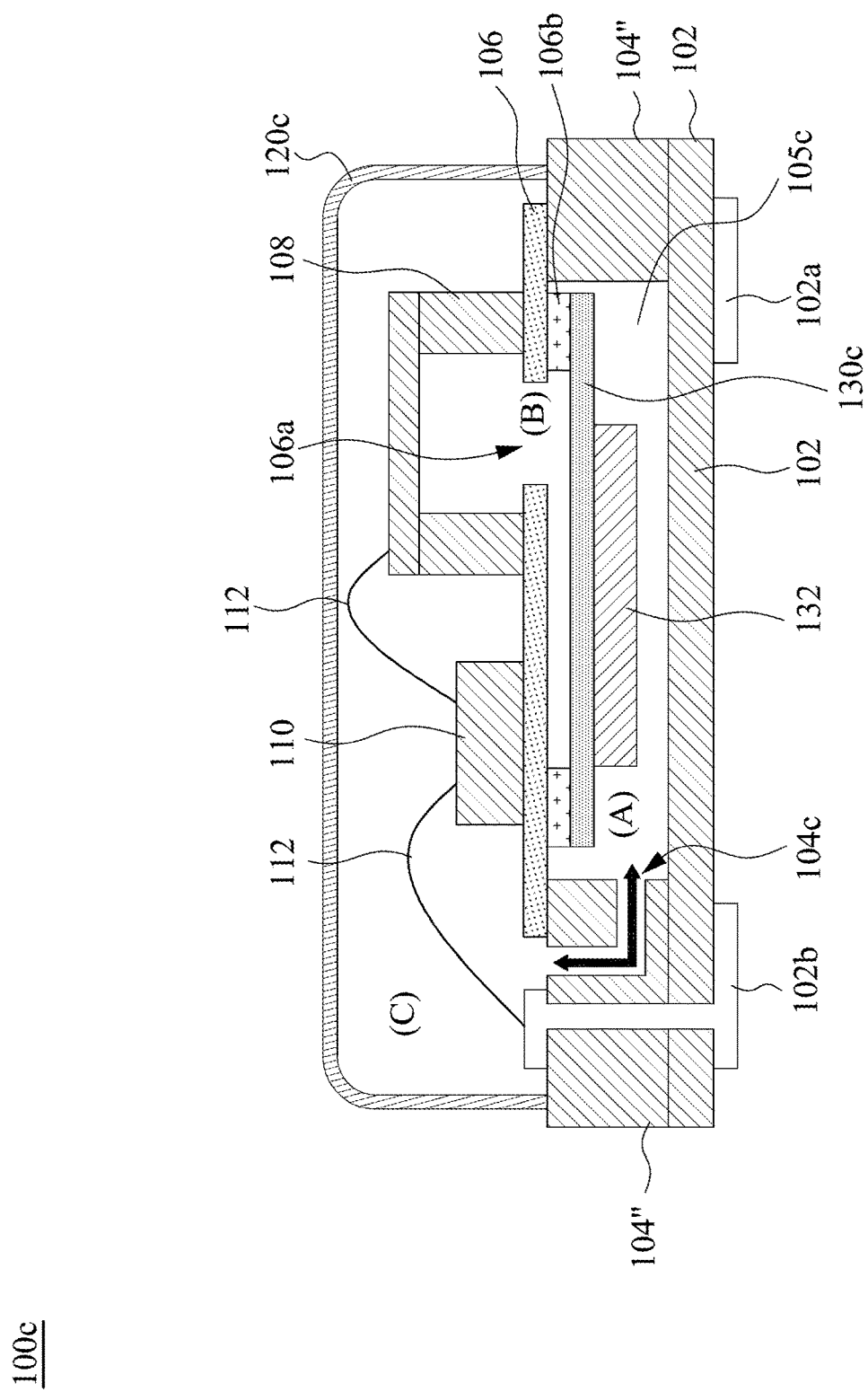
FIG. 3 illustrates a cross-sectional view of a vibration sensor according to still another embodiment of the present disclosure.
Figure 4:
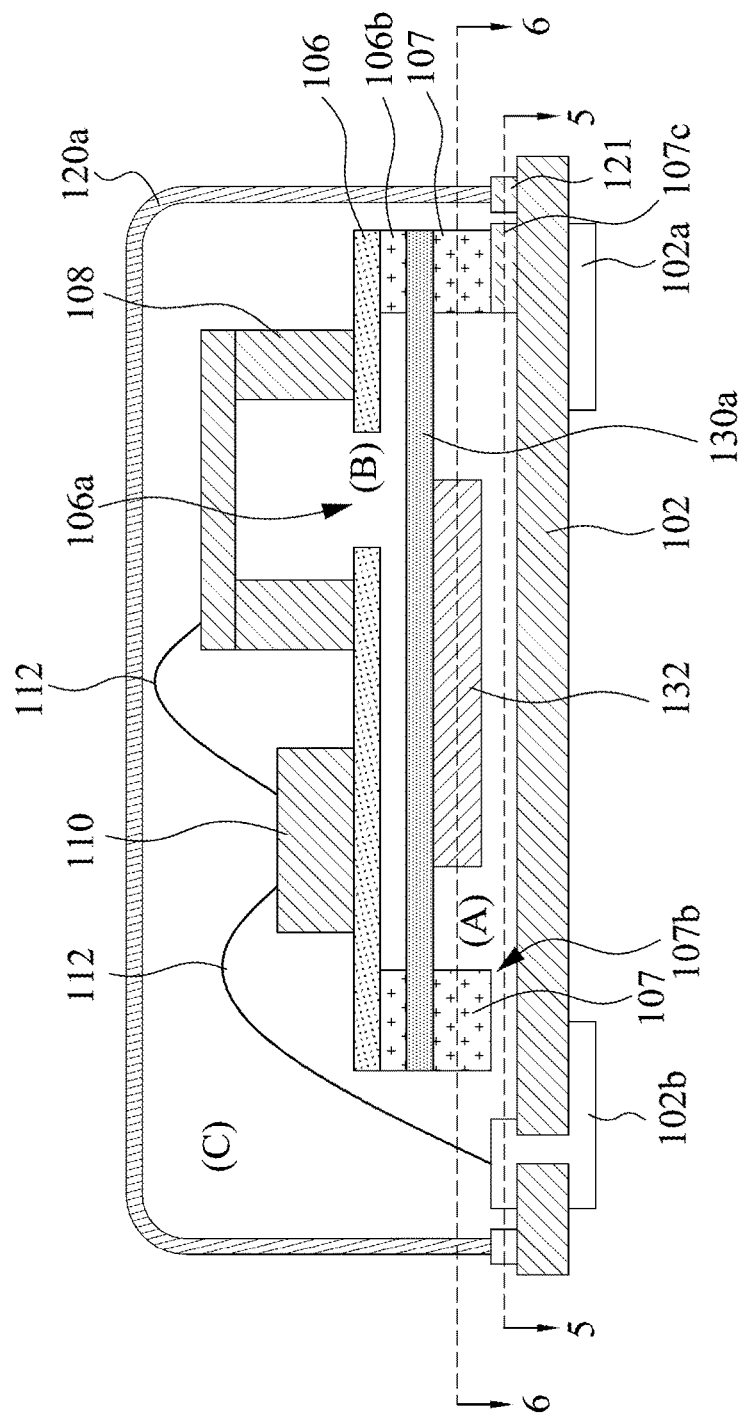
FIG. 4 illustrates a cross-sectional view of a vibration sensor according to still another embodiment of the present disclosure.

Reference is made to FIG. 3, which illustrates a cross-sectional view of a vibration sensor according to still another embodiment of the present disclosure. A vibration sensor 100c includes a circuit board 102, a metal housing 120c, and a pressure sensing device. The circuit board 102 has a concave recess 105c. The pressure sensing device is located over the concave recess 105c of the circuit board 102 to jointly define a first chamber (A). The pressure sensing device includes at least a support board 106, a sensor 108, and a pressure-enhancing member. The pressure-enhancing member includes at least a diaphragm 130c and a mass 132 fixed to the diaphragm 130c. The support board 106, the sensor 108, and the diaphragm 103c of the pressure-enhancing member jointly define a second chamber (B). The mass 132 is located in the first chamber (A).

The circuit board 102 further includes a sidewall 104" on its periphery, and the circuit board 102 and the sidewall 104" jointly define the concave recess 105c. A bottom end of the metal housing 120c abuts a top surface of the sidewall 104".

The support board 106 also has a surrounding convex portion 106b to which the diaphragm 130c is attached. The sensor 108 and the signal processing chip 110 are electrically connected to the circuit board 102 through metal wires 112, and the circuit board 102 is electrically connected to external components through its electrodes (102a, 102b). In this embodiment, an area of the diaphragm 130c is smaller than an area of the support board 106, but not being limited thereto.

The metal housing 120c is mounted on the sidewall 104" of the circuit board 102 and defines a third chamber (C) together with the circuit board 102. The metal housing 120c covers the pressure-enhancing member and the pressure sensing device. Under the shielding of the metal housing 120b, the pressure sensing device has better EMI resistance. Furthermore, the first chamber (A), the second chamber (B) and the third chamber (C) are all formed between the metal housing 120a and the circuit board 102, and an air-containing volume of the first chamber (A) is smaller than that of the third chamber (C). This design helps increase air damping under the diaphragm 130c, thereby making a smooth frequency response of the diaphragm 130c to meet with the characteristics required by the vibration sensor.

In this embodiment, the sidewall 104" may optionally have a first through hole 104c, so that the first chamber (A) could vent to the third chamber (C) via the first through hole 104c, but not limited thereto. The cross-section of the first through hole 104c has a bent angle (for example, the L-shaped bent cross-section in the figure). In addition, the support board 106 also has a second through hole 106a aligned with the sensor 108.

Reference is made to FIGS. 4-7, which illustrates a vibration sensor according to still another embodiment of the present disclosure. A vibration sensor 100d includes a circuit board 102, a spacer 107, a housing 120a, and a pressure sensing device. The spacer 107 is mounted on the circuit board 102, and the pressure sensing device is mounted on the spacer 107. The circuit board 102, the spacer 107 and the pressure sensing device jointly form a first chamber (A) and an air gap 107b. The pressure sensing device includes at least a support board 106, a sensor 108, and a pressure-enhancing member. The pressure-enhancing member includes at least a diaphragm 130a and a mass 132 fixed on the diaphragm 130a, wherein the support board 106, the sensor 108 and the diaphragm 130a of the pressure-enhancing member jointly define a second chamber (B). The mass 132 is located in the first chamber (A) that faces toward the circuit board 102. Of course, the location of the mass 132 is not limited thereto. In addition, in other embodiments, the mass 132 may also be located in the second chamber (B) that faces toward the sensor 108. In some embodiments, the second chamber (B) is located between the first chamber (A) and the third chamber (C). In some embodiments, the diaphragm 130a is located between the first chamber (A) and the second chamber (B).

Figure 5:
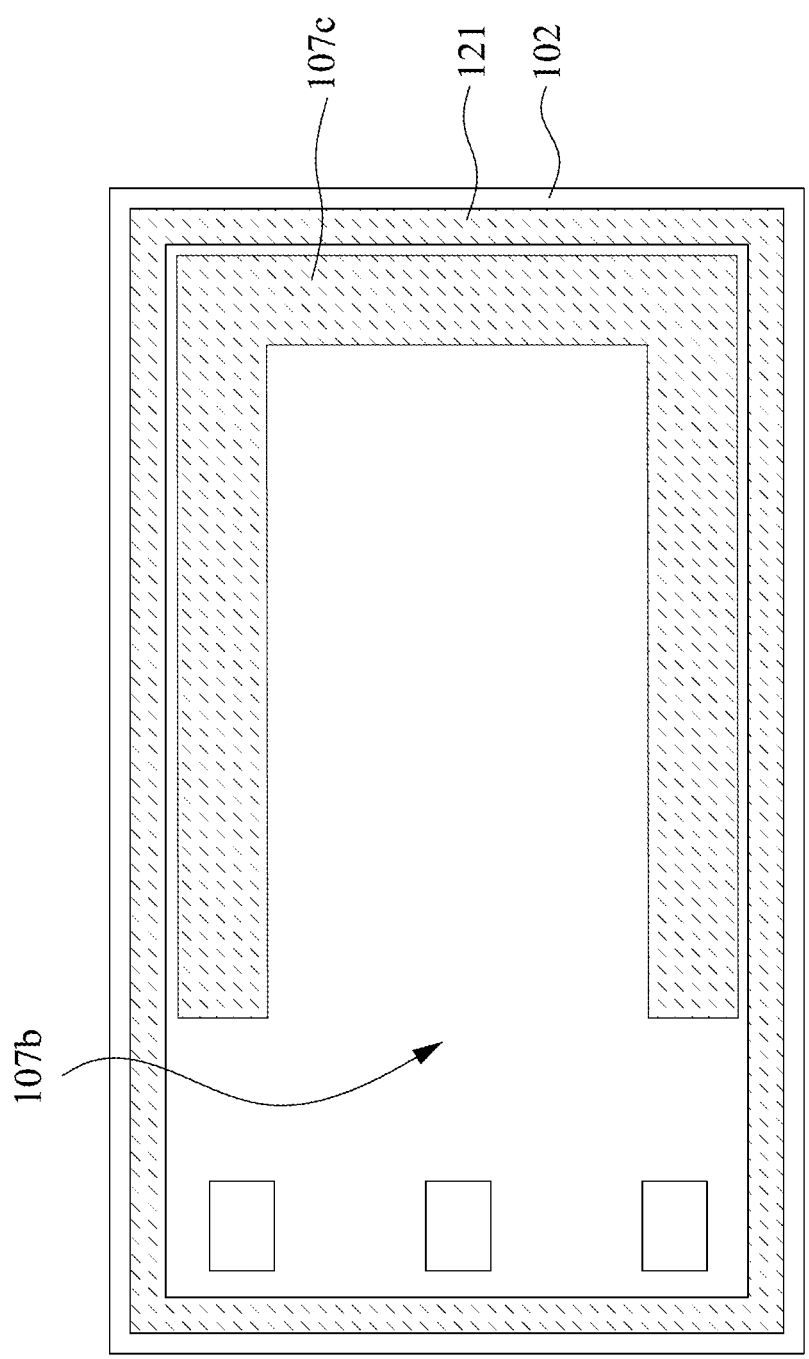
FIG. 5 illustrates a cross-sectional view of the vibration sensor along the line 5-5 in FIG. 4.
Figure 6:
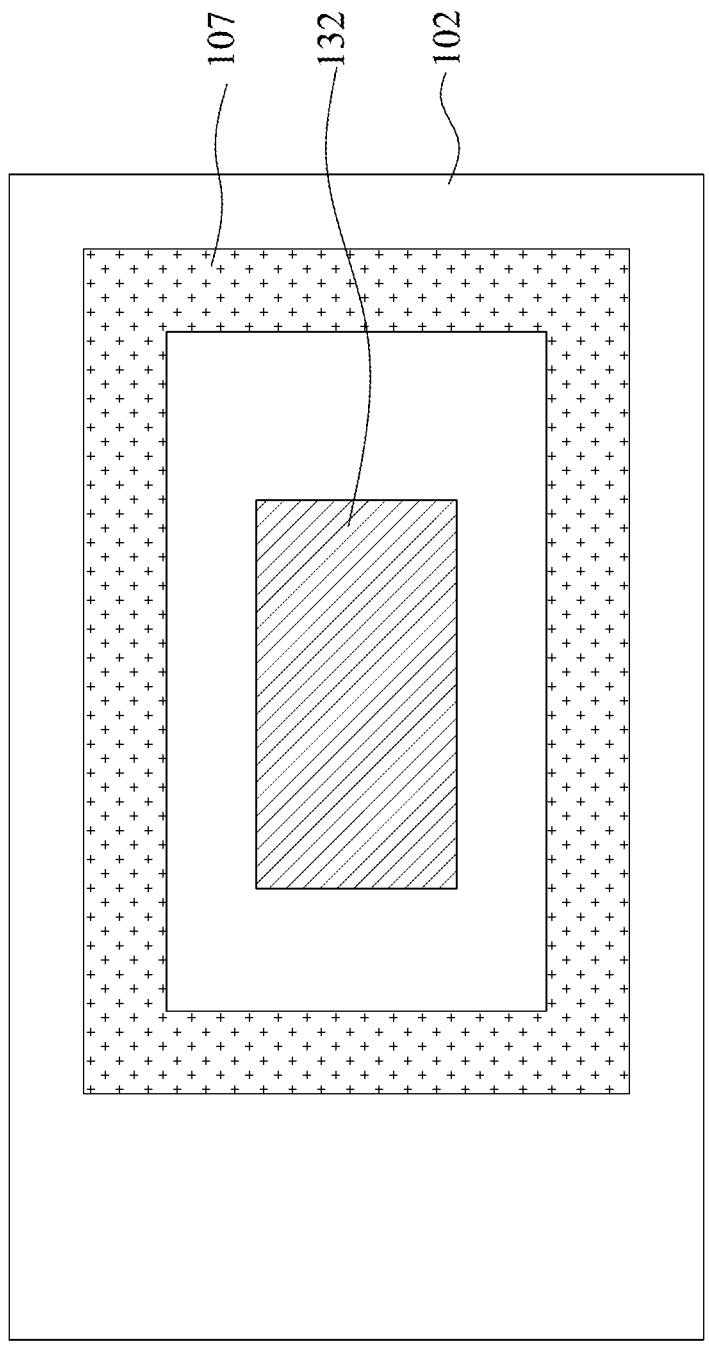
FIG. 6 illustrates a cross-sectional view of the vibration sensor along the line 6-6 in FIG. 4.
Figure 7:
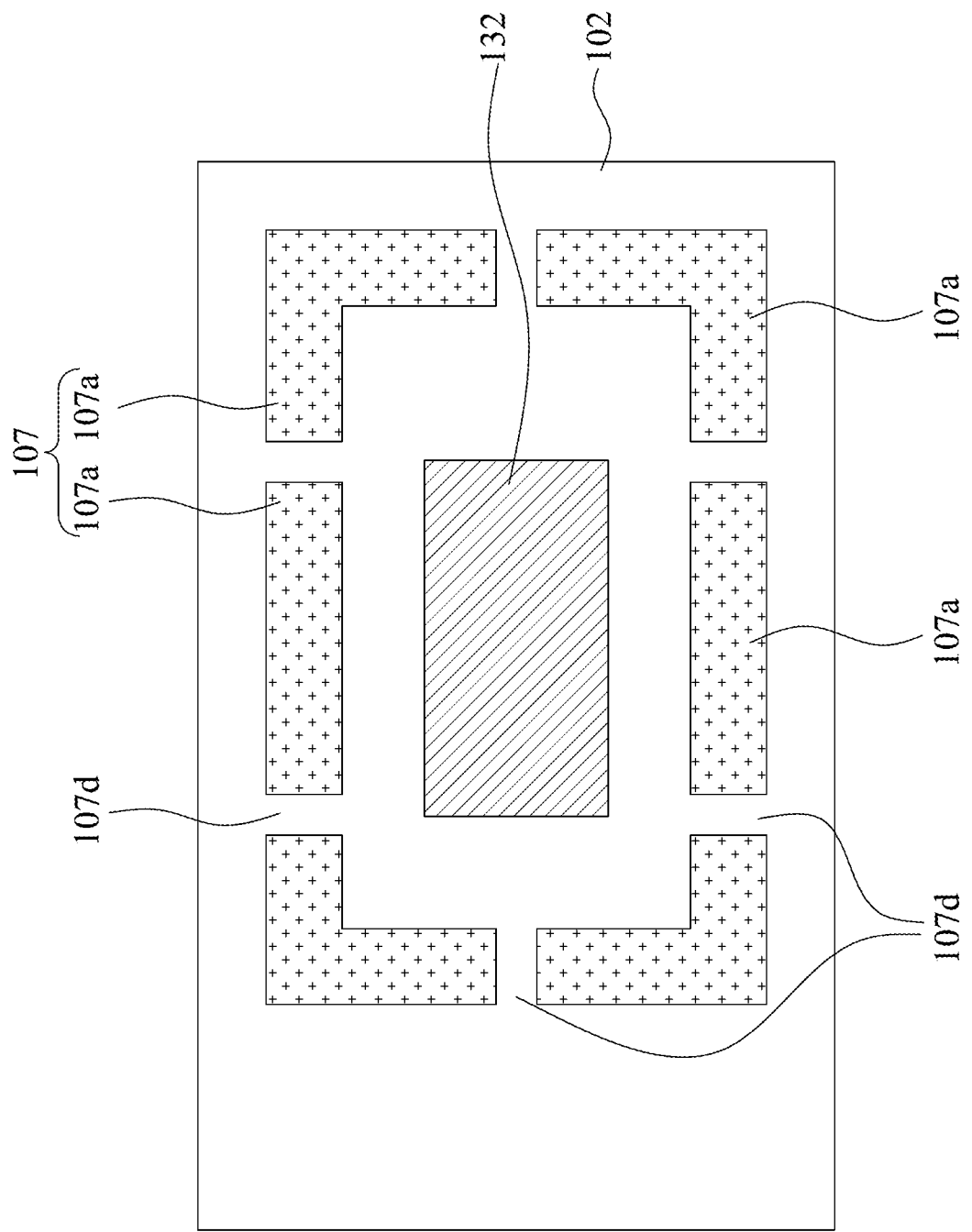
FIG. 7 illustrates another cross-sectional view of the vibration sensor along the line 6-6 in FIG. 4.

In some embodiments, the spacer 107 can be made of metal materials, plastic materials, silicon-based materials or the same PCB materials as the circuit board 102. In some embodiments, the spacer 107 is a rectangular closed-loop ring as illustrated in FIG. 6. In some embodiments, an adhesive layer 107c is filled between the spacer 107 and the circuit board 102, and the air gap 107b is formed in an adhesive-absent section between the spacer 107 and the circuit board 102 as illustrated in FIG. 5. In some embodiments, the adhesive layer 107c has a U-shaped cross-section as illustrated in FIG. 5, and the air gap 107b is formed in the section not filled with the adhesive layer 107c. In other embodiments, the spacer 107 may include a plurality of blocks 107a (referring to FIG. 7), and air gaps 107d are formed between any adjacent two of the blocks 107a.

The support board 106 also has a surrounding convex portion 106b abutting against the diaphragm 130a. The sensor 108 and the signal processing chip 110 are electrically connected to the circuit board 102 through metal wires 112, and the circuit board 102 is electrically connected to external components through its electrodes (102a, 102b). In this embodiment, the convex portion 106b is a metal portion.

The housing 120a is mounted on the circuit board 102 by an adhesive 121 and defines a third chamber (C) together with the circuit board 102. The housing 120a covers the pressure-enhancing member and the pressure sensing device. The housing 120a can be made of metal materials or dielectric materials covered with a metal layer. Under the shielding of the housing 120a, the pressure sensing device is more effective against electromagnetic interference (EMI). The first chamber (A), the second chamber (B) and the third chamber (C) are all formed between the housing 120a and the circuit board 102. The air gap 107b serves as a vent between the first chamber (A) and the third chamber (C). This design helps to increase vibrations of the diaphragm 130a, thereby enhancing sensitivity of the sensor 108, which meets the characteristics required by the vibration sensor.

When the external vibration occurs, the pressure-enhancing member in the previous embodiments generates associated vibration, and the pressure sensing device is used to sense the pressure change caused by the vibration of the pressure-enhancing member. In the previous embodiments, the sensor 108 is a microphone device, and the signal processing chip 110 is used to receive and process the signals measured by the microphone device.

In the previous embodiment, the first through hole (104a-c) or the air gap (107b, 107d) is designed such that the first chamber (A) could vent to the third chamber (C), and the first chamber is combined with the third chamber to obtain a communicable air volume. When the pressure-enhancing member moves to squeeze the air in the second chamber, the sensitivity of the pressure sensing device will be greatly improved, and the vibration sensor can obtain a signal with a higher signal-to-noise ratio. Furthermore, an air-containing volume of the first chamber is smaller than that of the third chamber, which helps to increase air damping under the diaphragm, thereby making a smooth frequency response of the diaphragm.

In summary, the vibration sensor disclosed herein includes a circuit board, a pressure-enhancing member, a pressure sensing device, and a metal housing to define the first, second, and third chambers. The metal housing covers the pressure-enhancing member and the pressure sensing device. Under the shielding of the metal housing, the pressure sensing device is more effective against electromagnetic interference (EMI). The circuit board has a sidewall to define a concave recess and the sidewall has a first through hole as a vent between the first chamber and the third chamber. The first chamber is combined with the third chamber to obtain a communicable air volume. When the pressure-enhancing member moves to squeeze the air in the second chamber, the sensitivity of the pressure sensing device will be greatly improved, and the vibration sensor can obtain a signal with a higher signal-to-noise ratio. Furthermore, an air-containing volume of the first chamber is smaller than that of the third chamber, which helps to increase air damping below the diaphragm, thereby making a smooth frequency response of the diaphragm.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A vibration sensor comprising:
    a circuit board;
    a spacer disposed on the circuit board;
    a pressure sensing device disposed on the spacer, wherein the circuit board, the spacer and the pressure sensing device jointly form a first chamber and an air gap, wherein the pressure sensing device comprises a support board, a sensor and a pressure-enhancing member, wherein the pressure-enhancing member comprises a diaphragm and a mass, wherein the support board, the sensor and the diaphragm of the pressure-enhancing member collectively define a second chamber; and
    a housing disposed on the circuit board and defining a third chamber along with the circuit board, wherein the air gap allows the first chamber venting to the third chamber.

2. The vibration sensor of claim 1, wherein the spacer is a rectangular closed-loop ring.

3. The vibration sensor of claim 1, wherein the spacer includes a plurality of blocks, the air gap is formed between any adjacent two of the blocks.

4. The vibration sensor of claim 1, further comprising an adhesive layer disposed between the spacer and the circuit board, and the air gap is formed in an adhesive-absent section between the spacer and the circuit board.

5. The vibration sensor of claim 4, wherein the adhesive layer has a U-shaped cross-section.

6. The vibration sensor of claim 1, wherein the support board has a second through hole aligned with the sensor.

7. The vibration sensor of claim 1, wherein the second chamber is disposed between the first chamber and the third chamber.

8. The vibration sensor of claim 7, wherein the diaphragm is disposed between the first chamber and the second chamber.

9. The vibration sensor of claim 1, wherein the housing is made of metal materials or dielectric materials covered with a metal layer.

10. The vibration sensor of claim 1, wherein the first, second and third chambers are all disposed between the housing and the circuit board, and the first chamber has an air-containing volume smaller than that of the third chamber.

* * * * *